United States Patent
Hattori et al.

[11] 4,003,813
[45] Jan. 18, 1977

[54] METHOD OF MAKING A MAGNETIC OXIDE FILM WITH HIGH COERCIVE FORCE

[75] Inventors: Seizi Hattori, Asahi; Nobuo Inagaki, Katsuta; Yoshikazu Ishii, Mito, all of Japan

[73] Assignee: Nippon Telegraph and Telephone Public Corporation, Tokyo, Japan

[22] Filed: Aug. 14, 1975

[21] Appl. No.: 604,774

[30] Foreign Application Priority Data
Aug. 26, 1974 Japan .................. 49-97647

[52] U.S. Cl. .................. 204/192; 340/174 TF; 360/131
[51] Int. Cl.² .................. C23C 15/00; B05D 5/12; G11B 23/00
[58] Field of Search .................. 204/192; 427/130

[56] References Cited
UNITED STATES PATENTS

| | | | |
|---|---|---|---|
| 3,438,885 | 4/1969 | Lewis et al. .................. | 204/192 |
| 3,650,921 | 3/1972 | Peters et al. .................. | 204/192 |
| 3,681,227 | 8/1972 | Szupillo .................. | 204/192 |
| 3,795,542 | 3/1974 | Halaby et al. .................. | 204/192 X |
| 3,829,372 | 8/1974 | Heller .................. | 204/192 |
| 3,929,604 | 12/1975 | Shirahata et al. .................. | 204/192 |

*Primary Examiner*—John H. Mack
*Assistant Examiner*—Aaron Weisstuch

[57] ABSTRACT

A magnetic oxide film manufacturing method is disclosed which involves the steps of sputtering a target made of iron and aluminum to form a film of non-magnetic iron oxide ($\alpha$-$Fe_2O_3$) and reducing the film to obtain a magnetic oxide film. When a target made of iron and aluminum is employed, it is possible to obtain a high coercive force magnetic oxide film which is highly adhesive to a substrate, excellent in surface roughness and less than 0.3µm in thickness. Accordingly, it is possible to obtain a magnetic disk of high magnetic recording density.

7 Claims, 11 Drawing Figures

FIG. IA
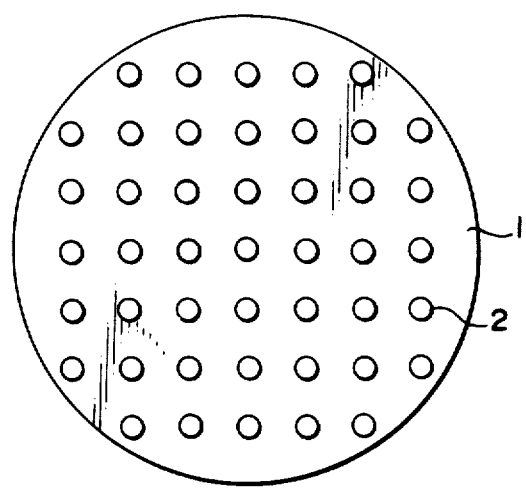
FIG. IB
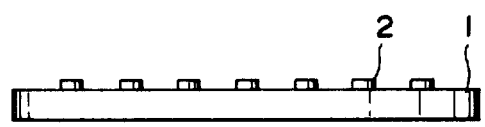

METHOD OF MAKING A MAGNETIC OXIDE FILM WITH HIGH COERCIVE FORCE

BACKGROUND OF THE INVENTION

1. Field of the Invention

This invention relates to a method of making a magnetic oxide film for a magnetic disk or the like, and more particularly to a method of making a homogeneous magnetic medium of high coercive force with high efficiency and with ease.

2. Description of the Prior Art

For enhancement of the magnetic recording density of a file memory, in particular, a magnetic disk, the following two points are generally indispensable: to increase the coercive force of a recording medium and to form the medium as thin as possible.

Conventional methods for the manufacture of a magnetic oxide film for magnetic disks include a particulate coating method, a method of forming a film of $Fe_2O_3$ from a solution of ferric chloride and reducing it to magnetic oxide and a method of forming alternating layers of magnetic iron and its oxide upon a substrate by controlling a sputtering atmosphere.

The particulate coating method employs a binder to provide for enhanced adhesiveness of fine oxide particles to a substrate and increased tightness of bonding of the particles. This reduces the density of the magnetic oxide contained in the resulting film, and hence is not suitable for obtaining high magnetic recording density. With the present coating techniques, it is very difficult to reduce the thickness of the film to less than $0.3\mu m$. Further, it is also impossible to increase the coercive force of the film more than 500 Oe.

With the method of forming a film of $Fe_2O_3$ from a solution of ferric chloride, and reducing it to magnetite (U.S. Pat. No. 3,620,841 (1971)), since the thickness of the film coated at one time is small, it is necessary to repeat the process of coating and drying the film a plurality of times, and consequently this method is low in work efficiency.

Further, the method of forming alternating layers if magnetic iron and its oxide upon a substrate by controlling a sputtering atmosphere (U.S. Pat. No. 3,829,372 (1974)) requires apparatus for controlling the oxygen partial pressure in the sputtering process and involves a control of the absolute values of the thicknesses of iron and iron oxide to provide for increased coercive force of the thin film and maintain it at the constant value. This method has the advantages of requiring sophisticated apparatus and a high degree of control.

SUMMARY OF THE INVENTION

Accordingly, one object of this invention is to provide a method of making a homogeneous, high coercive force magnetic medium with high efficiency and with ease.

Another object of this invention is to provide a method of making a high coercive force magnetic film which can be used for a magnetic disk and is highly adhesive to the substrate, excellent in surface roughness and in mechanical strength and has a thickness of less than $0.3\mu m$.

In accordance with this invention, the abovesaid objects can be achieved by the steps of sputtering a target made of iron and aluminum in a certain atmosphere of argon and oxygen gas to form a non-magnetic iron oxide ($\alpha$-$Fe_2O_3$) having dissolved therein aluminum, and reducing the non-magnetic iron oxide to precipitate fine magnetic phases ($Fe_3O_4$) having dissolved therein aluminum.

The manufacturing process according to this invention comprises a step of sputtering for the formation of a non-magnetic iron oxide ($\alpha$-$Fe_2O_3$) film and a step of reducing said film for the formation of a magnetic oxide ($Fe_3O_4$). The feature of this invention resides in the composition of the film which is made of not only iron but also aluminum. The addition of aluminum provides high coercive force.

BRIEF DESCRIPTION OF THE DRAWINGS

FIGS. 1A and 1B are a front and a side view of a target for use in this invention, respectively;

DESCRIPTION OF THE PREFERRED EMBODIMENTS

In accordance with this invention, sputtering of a target made of iron and aluminum is achieved in a mixed atmosphere of argon and oxygen gas to form a film of non-magnetic iron oxide ($\alpha$-$Fe_2O_3$) having dissolved therein aluminum and then the film is reduced to thereby precipitate fine magnetic ($Fe_3O_4$) phases having aluminum dissolved therein.

For obtaining the film of non-magnetic iron oxide ($\alpha$-$Fe_2O_3$) containing aluminum in the form of solid solution, it is possible to employ a sputter target of iron containing a solid solution of aluminum. In the case of forming a large disk, for example, a 14-inch magnetic disk, it is necessary to use a homogeneous target of substantially the same size as the disk to be ultimately obtained. However, it is relatively difficult to obtain such a large and homogeneous target. In examples of this invention, an iron target 1 and small aluminum pieces 2 of single composition were combined with each other as shown in FIGS. 1A and 1B. In the examples, the target 1 and the small pieces 2 were 360mm and 5mm in diameter, respectively. The formation of the target having small disks of single composition is easy and has such an advantage that the amount of aluminum can be controlled by changing the density array of small aluminum pieces, that is, by changing the ratio of surface area of aluminum to the iron target. In FIGS. 1A and 1B, a sputter target was made of iron and aluminum and the amount of aluminum obtained in the resulting film was equal to the ratio of its surface area to the target. It is also possible to employ a target made of an iron-aluminum alloy and, in this case, the amount of aluminum obtained in the resulting film is a little less than twice the percent aluminum content in the alloy.

Figure 2:
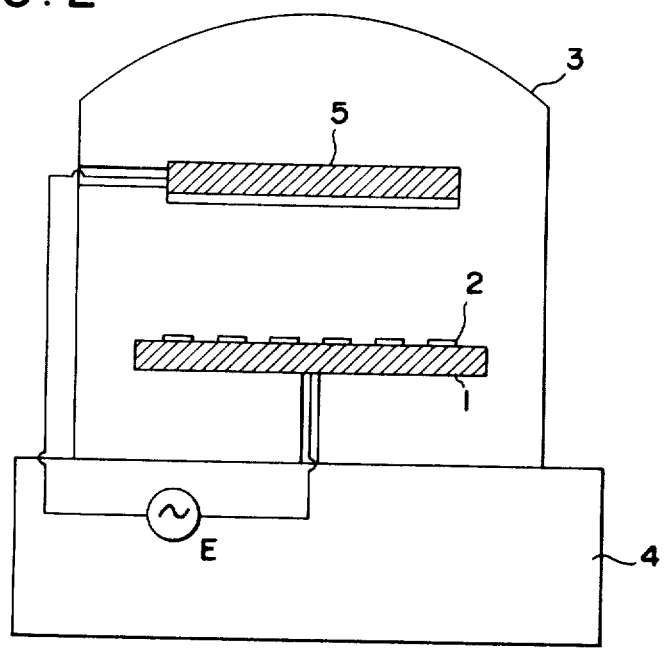
FIG. 2 is a schematic diagram, for explaining the step for the formation of a non-magnetic iron oxide ($\alpha$-$Fe_2O_3$) film by means of sputtering in accordance with this invention.

As illustrated in FIG. 2, after evacuation of vessel 3, a target electrode 1 and a substrate electrode 5 are disposed above and below in spaced relation to each other and a high-frequency voltage E is applied between the both electrodes. Reference numeral 4 indicates a power source unit and a control unit. When argon gas Ar is flowed into the vacuum vessel 3 held at $10^{-6}$Torr, argon ions bombard the target electrode 1 and iron particles ejected therefrom are deposited on the surface of the substrate electrode 5 to form a layer thereon. In this case, oxygen gas is flowed into the vessel 3 together with the argon gas. When the iron particles collide with the oxygen gas, reaction of oxygen occurs and iron oxide is deposited on the substrate electrode 5. As the oxidation proceeds, iron oxides form in the following sequence of steps.

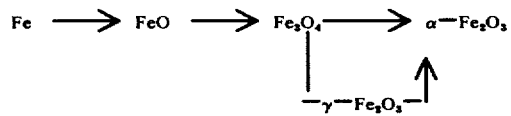

When an iron target 1 having aluminum pieces mounted thereon is used, sputtering is carried out in accordance with the ratio of the surface area of the aluminum pieces to the target 1 and non-magnetic iron oxide ($\alpha$-$Fe_2O_3$) containing aluminum is obtained on the substrate electrode 5.

Sputtering conditions suitable for obtaining the non-magnetic iron oxide ($\alpha$-$Fe_2O_3$) are not so severe.

Figure 3:
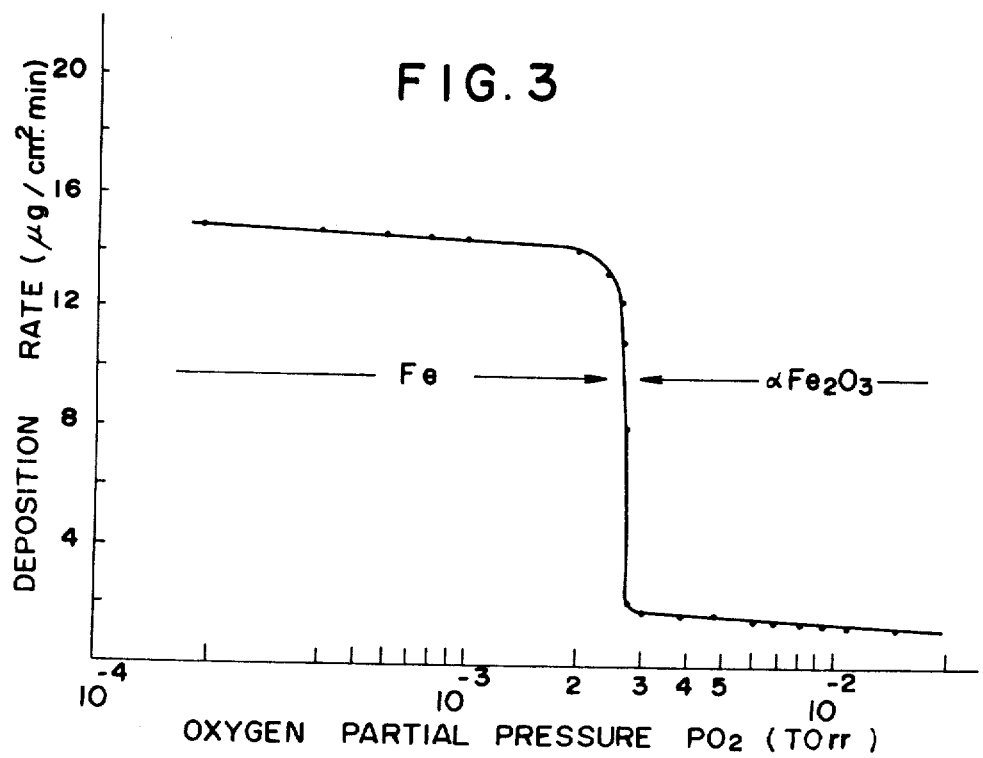
FIG. 3 is a graph showing the relationship between oxygen partial pressure and the deposition rate of a product in the sputtering.

FIG. 3 shows the relationship between oxygen partial pressure and the deposition rate of the product.

With oxygen partial pressures above $3 \times 10^{-3}$Torr, stable non-magnetic iron oxide ($\alpha$-$Fe_2O_3$) films can be formed. The region in which the desired magnetic ferric oxide (magnetite $Fe_3O_4$) can be directly formed is very narrow and is difficult to reliably obtain.

Control of the thickness of the film is easy because it is sufficient only to control the sputtering time if the sputtering voltage and the sputtering atmosphere are held constant. With a sputtering voltage of 1.5KV and under the abovesaid atmosphere, a 0.2$\mu$m thickness film can be formed in 40 minutes.

The sputtering step is followed by a reduction step. When maintained under hydrogen atmosphere at 300° C, the non-magnetic phase ($\alpha$-$Fe_2O_3$) changes to a magnetic phase ($Fe_3O_4$) in about an hour.

Figure 4:
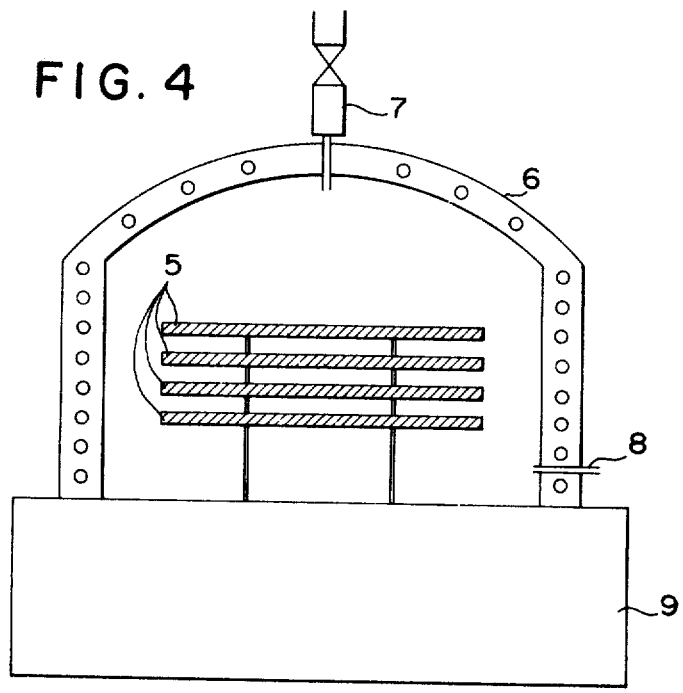
FIG. 4 is a schematic diagram, for explaining the step for the formation of a magnetic oxide ($Fe_3O_4$) by reducing the non-magnetic iron oxide ($\alpha$-$Fe_2O_3$) film in accordance with this invention.

FIG. 4 is a cross-sectional view of a heating reduction furnace. In the reduction furnace 6, a plurality of magnetic disk substrates 5 covered with the non-magnetic film ($\alpha$-$Fe_2O_3$) are placed one above another on a support. When hydrogen gas $H_2$ is passed into the reduction furnace 6 from an inlet 7 while rotating the support by a power source-control unit 9, the magnetic disk substrates 5 are held uniformly under hydrogen atmosphere. The hydrogen gas $H_2$ is removed from outlet 8 after circulating through the furnace 6.

Where the film deposited on the surface of the magnetic disk substrate 5 is the non-magnetic iron oxide ($\alpha$-$Fe_2O_3$) having aluminum dissolved therein, the aluminum is present in the form of a solid solution in the magnetic oxide ($Fe_3O_4$) formed by the reduction.

Whether aluminum has been dissolved in the magnetic oxide ($Fe_3O_4$) or not can be detected by measuring the lattice spacing and saturation magnetization of the magnetic oxide ($Fe_3O_4$).

Since the ion radius of aluminum is smaller than that of iron, the lattice spacing of the magnetic oxide ($Fe_3O_4$) decreases as aluminum is dissolved therein. Further, since aluminum is replaced at the b-site of the spinel lattice, the superexchange interaction between sublattices A and B is weakened. As aluminum is dissolved, the saturation magnetization also decreases.

Figure 5:
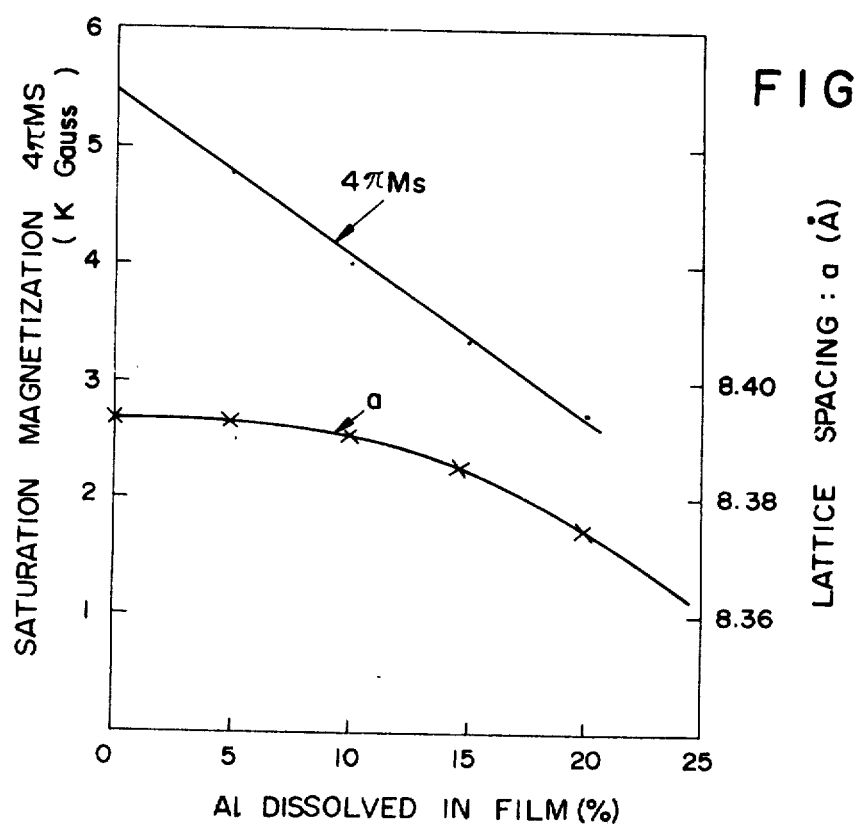
FIG. 5 is a graph showing the relationship between the aluminum content in the film and the lattice spacing and saturation magnetization of the magnetic oxide ($Fe_3O_4$)

FIG. 5 shows the relationships between the aluminum content in the resulting film and the lattice spacing and saturation magnetization of the magnetic oxide ($Fe_3O_4$) formed by the reduction.

When aluminum is dissolved in the non-magnetic oxide ($\alpha$-$Fe_2O_3$), the rate of reduction is retarded and the temperature range for obtaining the magnetic oxide ($Fe_3O_4$) is wide enough to provide for increased margin for manufacture.

Figure 6A:
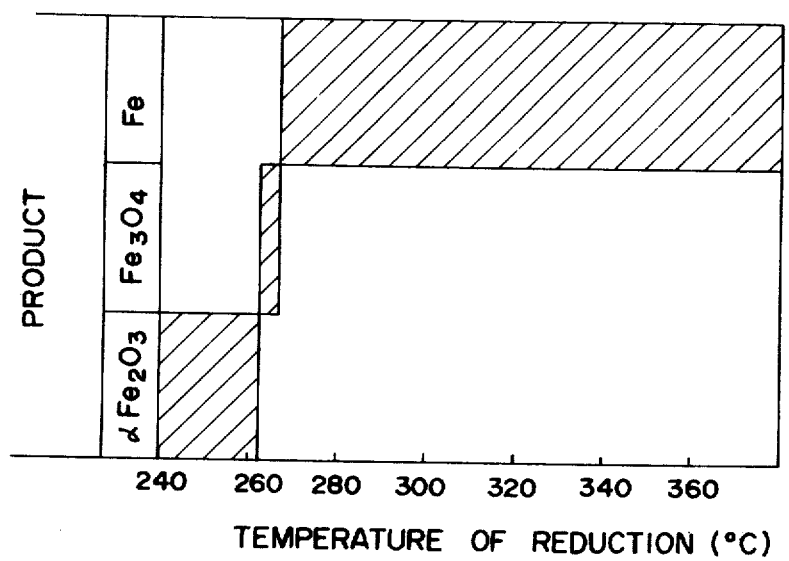
FIGS. 6A and 6B are graphs showing the temperature dependency of the reduction of the non-magnetic iron oxide ($\alpha$-$Fe_2O_3$) to the magnetic oxide ($Fe_3O_4$) in film containing and not containing aluminum, respectively.
Figure 6B:
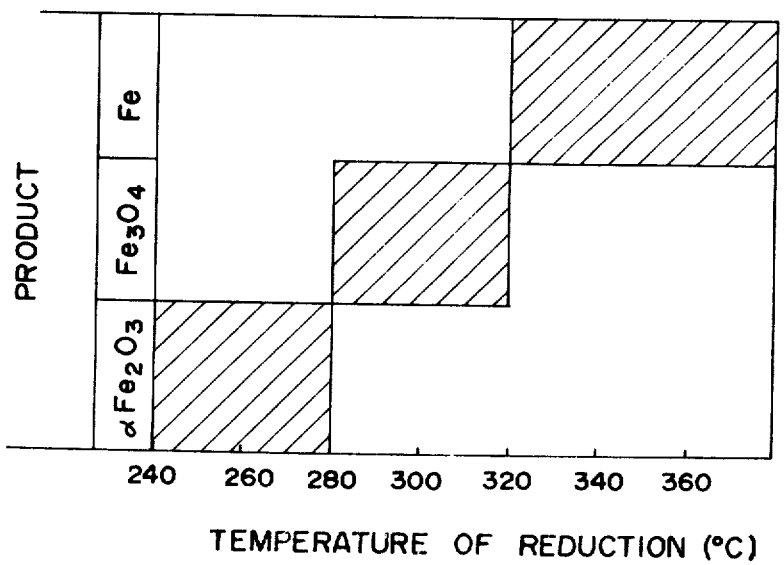

FIGS. 6A and 6B respectively show changes of the phases of an $\alpha$-$Fe_2O_3$ film without aluminum and an $\alpha$-$Fe_2O_3$ film containing 4% aluminum, with respect to the reduction temperature when the reduction time was one hour. In the case of the $\alpha$-$Fe_2O_3$ film without aluminum, the temperature range in which the magnetic ($Fe_3O_4$) phase is obtained is about 260° to 265° C. On the other hand, in the case of the $\alpha$-$Fe_2O_3$ film containing 4% of aluminum, magnetic oxide ($Fe_3O_4$) having aluminum dissolved therein is obtained over a temperature range of 280° to 320° C.

Figure 7:
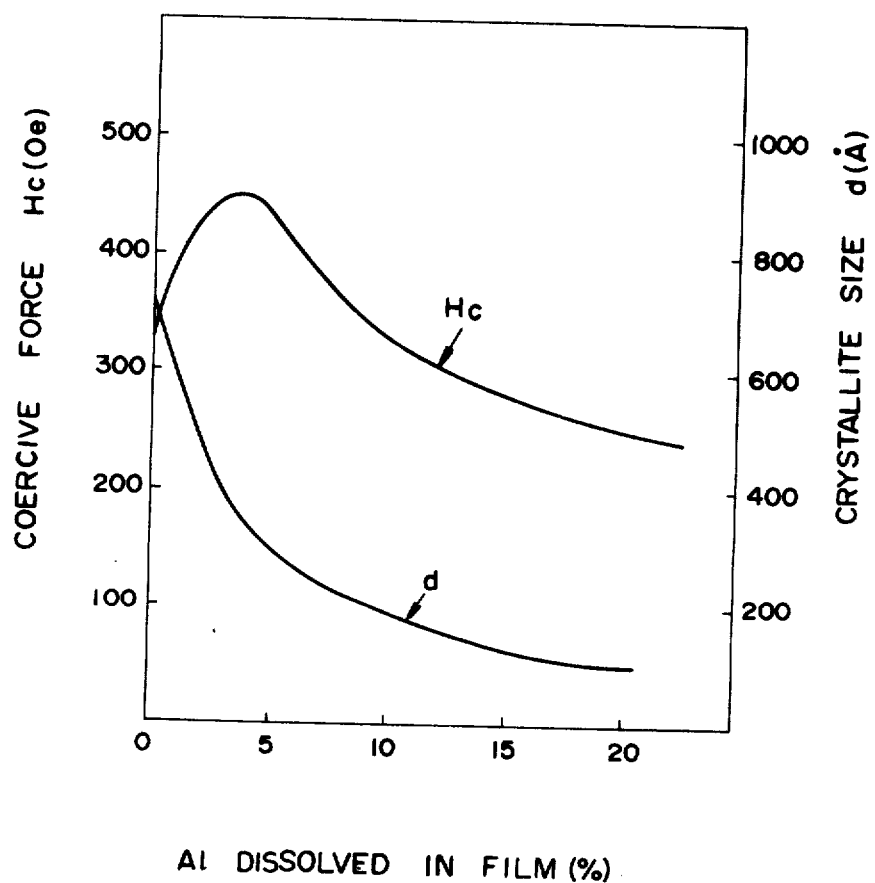
FIG. 7 is a graph showing the relationship between the aluminum content in the film and the coercive force of the resulting magnetic oxide ($Fe_3O_4$) film and its crystallite size obtained by X-rays.

FIG. 7 shows the relationship between the percent aluminum dissolved in the film and the coercive force and crystallite size (obtained by X-ray diffraction) of a magnetic film obtained under the abovesaid conditions, that is, under conditions for sputtering and reduction described previously. With 4% aluminum content, a film of high coercive force, about 450 Oe, is obtained and, in this case, the crystallite size is about 300A. With a crystallite size less than 300A, the particles become super-paramagnetic and the coercive force is decreased. Further, in the case of crystallite size more than 300A, domain walls do not rotate in unison and the coercive force is similarly reduced. The film of magnetic oxide ($Fe_3O_4$) is composed of such fine crystal particles as described above. With the crystallite size has a certain value, the crystal structure of the particle is only a single domain one but when the crystallite size exceeds the certain value, the crystal structure of the particle becomes a multidomain one to produce a domain wall, thereby decreasing the coercive force. When the crystallite size is further reduced, the single domain structure results but the magnetic domain becomes irregular and the film becomes thermally unstable, thus lowering coercive force.

Figure 8:
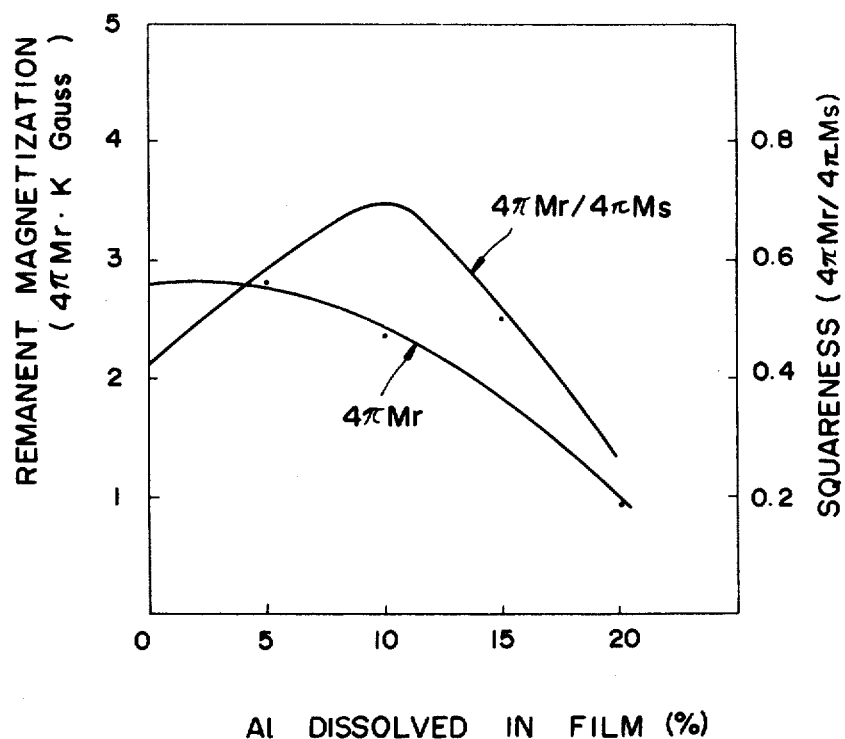
FIG. 8 is a graph showing the relationship between aluminum content in the film and the remanent magnetization and squareness ratio of the magnetic oxide ($Fe_3O_4$) film.

FIG. 8 shows the relationships between aluminum content and the remanent magnetization and squareness ratio of the film obtained under the aforesaid conditions. With about 4% aluminum content, which provides high coercive force, the remanent magnetization ($4\pi Mr$) decreases a little and the squareness ratio is enhanced. It is seen that the addition of aluminum improves not only coercive force but also other characteristics.

In this invention, however, priority is given to enhancement of the coercive force and the amount of aluminum contained in the film is selected to be in the range of 2 to 4% so as to maintain a crystallite size of about 300A.

The precipitated particles of magnetic oxide ($Fe_3O_4$) obtained by reduction can be made fine by dissolving aluminum in the non-magnet iron oxide as described above. This is the cause of the generation of the high coercive force.

Figure 9:
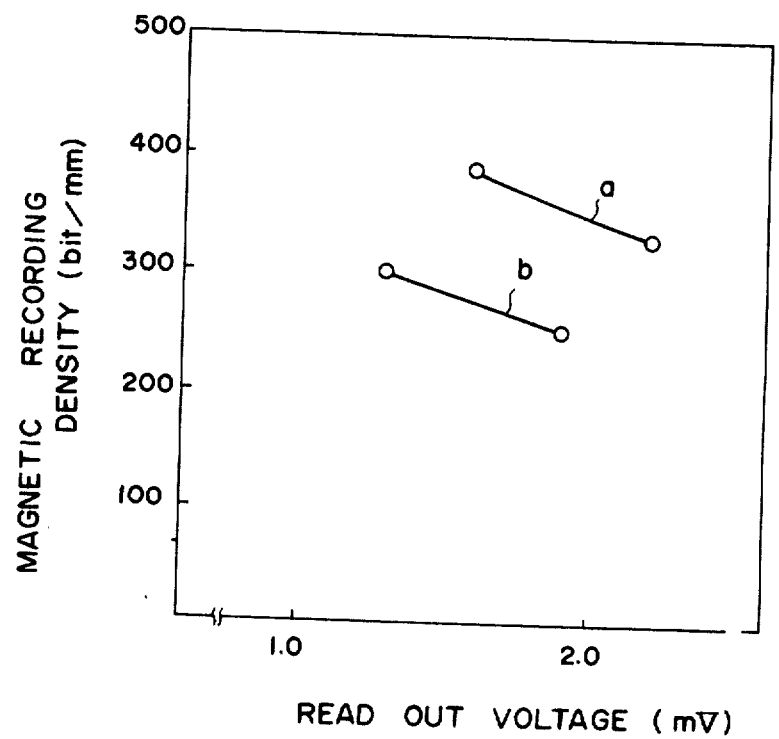
FIG. 9 is a graph for the comparison of magnetic properties of magnetic disks.

FIG. 9 shows the comparison of the characteristic (a) of the magnetic disk produced according to this invention with the characteristic (b) of a particlate coated disk now in use. A comparison of them at the same magnetic recording density indicates that the read-out voltage of the disk of this invention is about twice as high as the conventional disk. Further, another comparison of them at the same read-out voltage shows that the magnetic recording density of the disk of this invention is 40% higher than that of the conventional disk.

As has been described in the foregoing, this invention provides a method of making a high coercive force magnetic film with ease, which comprises the steps of simultaneously sputtering iron and aluminum in a mixed atmosphere of oxygen and argon gases to form non-magnetic iron oxide ($Fe_2O_3$) having aluminum dissolved therein and reducing it to precipitate fine (300A) magnetic oxide having aluminum dissolved therein, thus obtaining the magnetic film. Since the film is formed by sputtering, its adhesiveness to a substrate is excellent. Further, it is an oxide film, and hence is excellent in mechanical strength.

Examples of this invention will hereinafter be described.

EXAMPLE 1

A target, which was of 360mm diameter and made of iron (having a purity of 99.9%) and on which small disks (5mm diameter) of aluminum (having a purity of 99.9%) were mounted with a surface ratio of 4%, was used. A plate of aluminum alloy [96%Al—4%Mg] covered with aluminium anodic oxide film was used as a substrate. Under the following sputtering and reducing conditions, an $Fe_3O_4$ film 0.2$\mu$m thick was obtained. It has been ascertained by chemical analysis that 4% of aluminum was contained in the film.

Sputtering conditions
Sputtering voltage: 1.5KV
Atmosphere: 50%Ar — 50%$O_2$
Oxygen partial pressure: $10^{-2}$Torr.
Sputtering time: 40 minutes
Reducing conditions
Atmosphere:
  dry hydrogen
  flow rate: 5/min.
Temperature: 300° C
Time: 1 hr.

The resulting magnetic properties were as follows: coercive force (Hc) 450 Oe; saturation magnetization ($4\pi Ms$) 4800 gausses; remnant magnetization ($4\pi Mr$) 2800 gausses; and squareness ratio 0.58.

EXAMPLE 2

A target made of an iron-aluminum alloy was used. The alloy was composed of 96% of iron and 4% of aluminum. The same substrate and sputtering and reducing conditions as those adopted in Example 1 were employed.

The resulting magnetic properties were: Hc 350 Oe; $4\pi Ms$ 4300 gausses; $4\pi Mr$ 2600 gausses; and squareness ratio 0.61. As a result of chemical analysis of the composition of the $Fe_3O_4$ film obtained in this Example, 7.8% of aluminum was contained in the film. It has been found that in the case of a target made of an ironaluminum alloy, the aluminum sputtering efficiency is enhanced, as compared to the target formed of iron on which small aluminum pieces were mounted and that the amount of aluminum contained in the film is a little less than twice as large as that contained in the target.

EXAMPLE 3

A target made of an iron-aluminum alloy was used. The alloy was composed 98% of iron and 2% aluminum. The substrate was the sputtering and reducing conditions were the same as those employed in Example 1.

The resulting magnetic properties were Hc 440 Oe; $4\pi Ms$ 4700 gauss; $4\pi Mr$ 2700 gauss; and squareness ratio 0.57. It has been ascertained that less than 4% of aluminum was contained in the film.

EXAMPLE 4

A target, which was of 360mm diameter and made of a 96%Fe—4%Al alloy and on which small pieces 3mm diameter of cobalt were mounted with a surface area ratio of 2%, was used. The substrate and sputtering and reducing conditions were the same as those employed in Example 1.

The magnetic properties of the film obtained in this Example were Hc 5500e; $4\pi Ms$ 4200 gauss; $4\pi Mr$ 2600 gauss; and squareness ratio 0.62. The temperature change of the coercive force Hc was 1.1 to 1.3 (Oe/° C), which is substantially the same as that of the $\gamma$-$Fe_2O_3$ coated film now in use and this value is excellent.

A 360mm diameter iron target having mounted thereon 3mm diameter cobalt pieces with an area ratio of 2% was used and the substrate and sputtering and reducing conditions were the same as those in Example 1 except that the reducing temperature was 280° C. The magnetic properties of the magnetic oxide $Fe_3O_4$ thus obtained were Hc 5500e; $4\pi Ms$ 5100 gauss; $4\pi Mr$ 2600 gauss; and squareness ratio 0.51. However, it has been ascertained that the change of the coercive force Hc with temperature was as large as 2.8 to 3(Oe/° C).

The foregoing examples should be construed as merely illustrative of this invention and should not be construed as limiting the invention specifically thereto. And it will be apparent that many modifications and variations may be effected without departing from the scope of the novel concepts of this invention.

What is claimed is:

1. A method of making a high coercive force magnetic oxide film comprising the steps of sputtering a target made of iron and aluminum in an atmosphere containing an inert gas and oxygen with the oxygen above a certain partial pressure to form on a substrate an $\alpha$-$Fe_2O_3$ non magnetic oxide film having aluminum dissolved therein, and reducing said non-magnetic oxide film under a hydrogen gas atmosphere to yield an $Fe_3O_4$ magnetic oxide film having aluminum dissolved therein.

2. A method of making a high coercive force magnetic oxide film according to claim 1 wherein said target made of iron and aluminum is a target formed from an iron plate and having mounted thereon small pieces of aluminum and the ratio of surface area of said aluminum pieces to said iron plate is 2 to 4%.

3. A method of making a high coercive force magnetic oxide film according to claim 1 wherein said target made of iron and aluminum is formed of an iron-aluminum alloy with aluminum content of 1 to 2%.

4. A method of making a high coercive force magnetic oxide film according to claim 1 wherein said inert gas is argon and said oxygen is held above a partial pressure of $3 \times 10^{-3}$ Torr.

5. A method of making a high coercive force magnetic oxide film according to claim 1 wherein the reduction of said non-magnetic oxide under hydrogen gas atmosphere is carried out at a temperature in the range of 280° to 320° C.

6. A method of making a high coercive force magnetic oxide film comprising the steps of sputtering a target in a mixed atmosphere of argon and oxygen held at a partial pressure $3 \times 10^{-3}$ to form an $\alpha\text{-}Fe_2O_3$ non-magnetic oxide film having aluminum dissolved therein, said target being formed from an iron plate and having mounted thereon small aluminum pieces with a surface area ratio of 2 to 4% relative to said iron plate, and reducing said non-magnetic oxide under a hydrogen atmosphere at 280° to 320° C to form magnetic oxide having aluminum dissolved therein.

7. A method of making a high coercive force magnetic film comprising the steps of sputtering a target in a mixed atmosphere of argon and oxygen held at a partial pressure above $3 \times 10^{-3}$ Torr to form on a substrate an $\alpha\text{-}Fe_2O_3$ non-magnetic oxide film having aluminum dissolved therein, said target being made of an ironaluminum alloy composed of 1 to 2% of aluminum and the remainder iron, and reducing said non-magnetic oxide film under a hydrogen atmosphere at 280° to 320° C to form a magnetic oxide film having aluminum dissolved therein.

* * * * *